United States Patent [19]
Garofalo

[11] Patent Number: 5,636,002
[45] Date of Patent: Jun. 3, 1997

[54] AUXILIARY MASK FEATURES FOR ENHANCING THE RESOLUTION OF PHOTOLITHOGRAPHY

[75] Inventor: Joseph G. Garofalo, South Orange, N.J.

[73] Assignee: Lucent Technologies Inc., Murray Hill, N.J.

[21] Appl. No.: 550,879

[22] Filed: Oct. 31, 1995

Related U.S. Application Data

[63] Continuation-in-part of Ser. No. 235,721, Apr. 29, 1994, abandoned.

[51] Int. Cl.$^6$ .............................. G03B 27/54; G01B 11/00
[52] U.S. Cl. .................................. 355/53; 355/71; 355/74; 430/5
[58] Field of Search ........................................................ 430/5

[56] References Cited

U.S. PATENT DOCUMENTS

| | | | |
|---|---|---|---|
| 5,117,254 | 5/1992 | Kawashima et al. | 355/53 |
| 5,184,196 | 2/1993 | Nakazawa et al. | 355/53 |
| 5,286,581 | 2/1994 | Lee | 430/5 |
| 5,300,971 | 4/1994 | Kudo | 355/53 |
| 5,357,311 | 10/1994 | Shiraishi | 355/53 |

*Primary Examiner*—Safet Metjahic
*Assistant Examiner*—D. P. Malley
*Attorney, Agent, or Firm*—David I. Caplan

[57] ABSTRACT

This invention involves an optical system in which optical radiation containing a wavelength $\lambda$ is directed onto a patterned mask, in order to form an image feature on a photoresist layer located on the image plane of the system. The patterned mask has a main object feature, which has the form of the image feature. The object feature has a portion whose width is everywhere less than $(1.5)\lambda/NA$, where NA is the numerical aperture of the image side of the system. An assist feature whose width is everywhere less than $(0.5)\lambda/NA$ is located on the mask in a neighborhood of the portion of the main object feature. Advantageously, the optical radiation is directed through an annular aperture ("off-axis illumination") in an opaque screen and through a collimating lens onto the mask. In one exemplary situation, the assist feature is located outside the main object feature and has a distance of closest approach to the main object feature that is everywhere equal to less than $\lambda/NA$. In another exemplary situation, the assist feature is located inside the main object feature. In addition, advantageously the object and the assist features in the mask are defined by localized clear regions (optical transmission coefficient is equal to approximately unity) located in a relatively opaque field (optical transmission coefficient T=approximately 0.10), or are defined by localized relatively opaque regions located in a clear field, as the case may be.

20 Claims, 4 Drawing Sheets

5,636,002

AUXILIARY MASK FEATURES FOR ENHANCING THE RESOLUTION OF PHOTOLITHOGRAPHY

This application is a continuation-in-part of application Ser. No. 08/235,721, filed Apr. 29, 1994, now abandoned.

TECHNICAL FIELD

This invention relates to lithography, especially optical lithography, such as that used for fabricating semiconductor integrated circuit and other devices. More particularly, the invention relates to optical lithographic mask structures and to methods of making such structures, for use in lithography systems for fabricating such devices. These masks are also called "reticles" particularly when used in optical systems having magnifications different from unity.

BACKGROUND OF THE INVENTION

FIG. 1 shows a typical optical lithographic fabrication system 100 for delineating features in a workpiece 120. Typically the workpiece 120 comprises a semiconductor wafer (substrate), together with one or more layers of material(s) (not shown) located on a top major surface of the wafer. More specifically, typically monochromatic optical radiation of wavelength $\lambda$ emitted by an optical source 106, such as a mercury lamp, propagates successively through a pinhole aperture 15 in an opaque screen 105, an optical collimating lens or lens system 104, a patterned lithographic mask or reticle 103 having a pattern of apertures (object features in the form of bright regions) in an opaque material, and an optical focusing lens or lens system 102. The optical radiation emanating from the reticle 103 is focused by the lens 102 onto a photoresist layer 101 located on the top major surface of the workpiece 120. Thus the pattern of the reticle 103—that is, its pattern of transparent and opaque portions—is focused on the photoresist layer 101. Depending upon whether this photoresist is positive or negative, when it is subjected to a development process, typically a wet developer, the material of the photoresist is removed or remains at and only at areas where the optical radiation was incident. Thus, the pattern of the mask is transferred to ("printed on") the photoresist layer 101. Subsequent etching processes, such as wet etching or dry plasma etching, remove selected portions of the workpiece 120. Portions of the workpiece 120 thus are removed from the top surface of the workpiece 120 at areas underlying those where the photoresist layer 101 was removed by the development process but not at areas underlying those regions where the photoresist remains. Alternatively, instead of etching the workpiece, impurity ions can be implanted into the workpiece 120 at areas underlying those where the photoresist layer was removed by the development process but not at areas underlying where the photoresist remains. Thus, in an event, the pattern of the mask 103—i.e., each feature of the mask—is transferred to the workpiece 120 as is desired, for example, in the art of semiconductor integrated circuit fabrication.

As known in the art, the aperture 15 is located on the focal plane of the collimating lens 104, and the indicated distances L1 and L2 satisfy in cases of a simple lens 102: $1/L1 + 1/L2 = 1/F$, where F is the focal length of the lens 102.

In fabricating integrated circuits, it is desirable, for example, to have as many transistors per wafer as possible. Hence, it is desirable to have as small a transistor or other feature size as possible, such as the feature size of a metallization stripe—i.e., its width—or of an aperture in an insulating layer which is to be filled with metal, in order to form electrical connections, for example, between one level of metallization and another.

According to geometric optics if it is desired to print on the photoresist layer 101 the corresponding image feature having a width equal to W, an object feature having a width equal to C must be located on the mask (reticle) 103. Further, according to geometric optics if this feature of width equal to C is a simple aperture in an opaque layer, then the ratio W/C=m, where m=L2/L 1, and where m is known as the lateral magnification. When diffraction effects become important, however, instead of a sharp black-white image a diffraction pattern of the object feature C is formed on the photoresist layer 101, whereby the edges of the image become indistinct; hence the resolution of the features of the reticle 103, as focused on the photoresist layer and transferred to the workpiece, deteriorates.

Another problem, caused by diffraction, is "proximity effects"; that is, the actual printed width of an object feature of width L on the mask depends upon the distance (spaces or gaps, G) between neighboring object features on the mask. This problem arises in cases where $L \leq (0.7)\lambda/(NA)$, approximately, and at the same time $G/L \geq 2$, approximately, and where NA is the numerical aperture on the image side of the system 100.

Another consideration that arises in the system 100 is that of depth of focus (hereinafter: "DOF") of the image features on the photoresist layer 101 of the feature being imaged. If, for example, the DOF is less than the thickness of the photoresist (hereinafter: "PR") layer 101, then the edges of the image of the feature will be indistinct, and hence subsequent development of the PR layer will result in a feature therein whose sidewalls are undesirably not vertical. As a result, the dimensions of a printed feature deviates from the intended desired value. Moreover, in cases where the top surface of the wafer is not planar by an amount not insignificant as compared with the DOF, even if the thickness of the PR layer is less than the DOF, non-vertical sidewalls of the developed feature in the PR layer after development will likewise result, and an indeterminacy in the position of the sidewalls will also occur.

In prior art, in order to increase the DOF of a phase-shifting mask, the optical intensity transmission T of the opaque portions of the mask was set at a value in the approximate range of 0.05 to 0.15 typically at approximately 0.10, rather than zero. However, then the side lobes of the diffraction pattern are undesirably increased in intensity, at the expense of the central lobe. Also, OFF-axis (FIG. 2) illumination (instead of the previously described ON-axis illumination) was used to enhance the imaging by reason of not only increasing the DOF but also improving the magnitude of the maximum relative slope (dI/dx)/I in the central diffraction lobe of the image—where I=optical intensity, and x=horizontal distance along the PR layer.

An example of OFF-axis illumination is shown in the system 200 (FIG. 2) where, instead of a single pinhole aperture 15 in the screen 105, a thin annular aperture 25 subtending an angle equal to $2\alpha$ at the lens 104 is used. Typically, $\alpha=45°(=\pi/4$ radian), approximately. Alternatively, a pattern of apertures can be used to provide OFF-axis illumination, as known in the art. Parenthetically: the larger the magnitude of the maximum value of (dI/dx)/I in the central diffraction lobe, the more reproducible will be the printing of the image formed on the PR layer.

The use of OFF-axis illumination, however, thus improved the DOF only for some values of, for example, the width L of a line feature printed on the PR layer, where a "line feature" refers to a feature in which its length is equal to at least three times its width L. More specifically, although OFF-axis illumination enhanced the DOF for cases in which L was equal to or less than approximately $(0.75)\lambda/(NA)$ and at the same time the spaces G between adjacent line features was also equal to or less than approximately $(0.75)\lambda/(NA)$, nevertheless OFF-axis illumination degraded both the DOF and the (dI/dx)/I of the image for cases in which L was equal to or greater than $(0.75)\lambda/(NA)$. Thus in practical situations, especially random-layout logic chips—in which there are some image features for which L is less than or equal to approximately $(0.75)\lambda/(NA)$ and there are other image features for which L is greater than or equal to approximately $(1.0)\lambda/(NA)$—OFF-axis illumination gives rise to its own DOF problem. Also, it is desirable to counteract the sidelobe problem caused by setting T unequal to zero in a phase-shifting mask, which in turn was desirable to improve diffraction limitations. It is further desirable to set T unequal to zero in order to make the mask more useful for the more random layouts.

SUMMARY OF THE INVENTION

This invention involves an optical lithographic system in which an optical source directs optical radiation containing a wavelength $\lambda$ onto a patterned mask, to form an image feature on a photoresist layer located on the image plane of the system. The patterned mask has an object feature in the form of the image feature, and the object feature has a portion whose width is everywhere less than or equal to $\lambda/NA$, typically less than $(0.5)\lambda/NA$, where NA is the numerical aperture of the image side of the system. An assist feature, whose width is everywhere less than $(0.2)\lambda/NA$. In addition, the outside or the mask portion of the object feature (hereinafter "main feature") is located on the mask in a neighborhood of the portion of the object feature, and has a distance of closest approach to the portion of the main object feature that is everywhere equal to less than $(0.5)\lambda/NA$ or else is located on the mask inside the portion of the main feature object. As used herein, the term "assist feature" refers to a feature (pattern) located on the mask such that, when the mask is used as the reticle 103 in the system 100 (FIG. 1), the image of the assist feature on the photoresist layer 101 is sufficiently proximate to the image of the main feature thereon that the two images can be and is printed on the photoresist layer 101 as a single (merged) pattern—i.e., as though only a single (merged) image of the main and assist features had been formed. In addition, advantageously OFF-axis illumination is used: for example, the optical radiation is directed successively through an annular aperture in an opaque screen and through a collimating lens onto the mask.

In one specific embodiment ("bright field"), the assist feature is located outside the main object feature, and both the assist feature and the object main feature have optical intensity transmission coefficients T in the approximate range of T=0 to 0.15, advantageously 0.05 to 0.15. In another specific embodiment ("bright field"), the assist feature is transparent (T=1.0, approximately) and is located inside the main feature, while T of the remainder of the main feature is in the approximate range of T=0 to 0.10, advantageously 0.05 to 0.10. In another specific embodiment ("dark field"), the assist feature is transparent (T=1.0, approximately) and is located outside the main feature; while regions of the mask, located in areas between the assist feature and the main object feature, have optical transmission coefficients T in the approximate range of T=0 to 0.15, advantageously 0.05 to 0.15. In yet another specific embodiment ("dark field"), the main feature is transparent, and the assist feature is located inside the main object feature and has an optical transmission coefficient in the approximate range of T=0 to 0.15, advantageously 0.05 to 0.15.

In this way one or more of the following beneficial results can be obtained: enhanced printability (larger DOF and better diffraction resolution of the image feature;) of small, relatively isolated object features, as compared with the printability with unassisted OFF-axis illumination or with phase shifting masks; restored printability of larger features whose printability is normally reduced by OFF-axis illumination; and reduced printability of unwanted side lobes.

As mentioned above, another problem that arises in the use of an optical lithographic mask is "proximity effects"; that is, the actual printed width of a feature of width L on the mask depends upon the distance G between neighboring object features on the mask. The use of the assist features of this invention enables minimization of the proximity effects: that is, by using the invention the printed size of an object feature is less dependent on the presence of neighboring object features.

BRIEF DESCRIPTION OF THE DRAWINGS

Only for the sake of clarity, none of the FIGURES. is drawn to any scale. In different FIGURES., elements that are the same, or are similar, are denoted by the same reference numerals.

DETAILED DESCRIPTION

Figure 1:
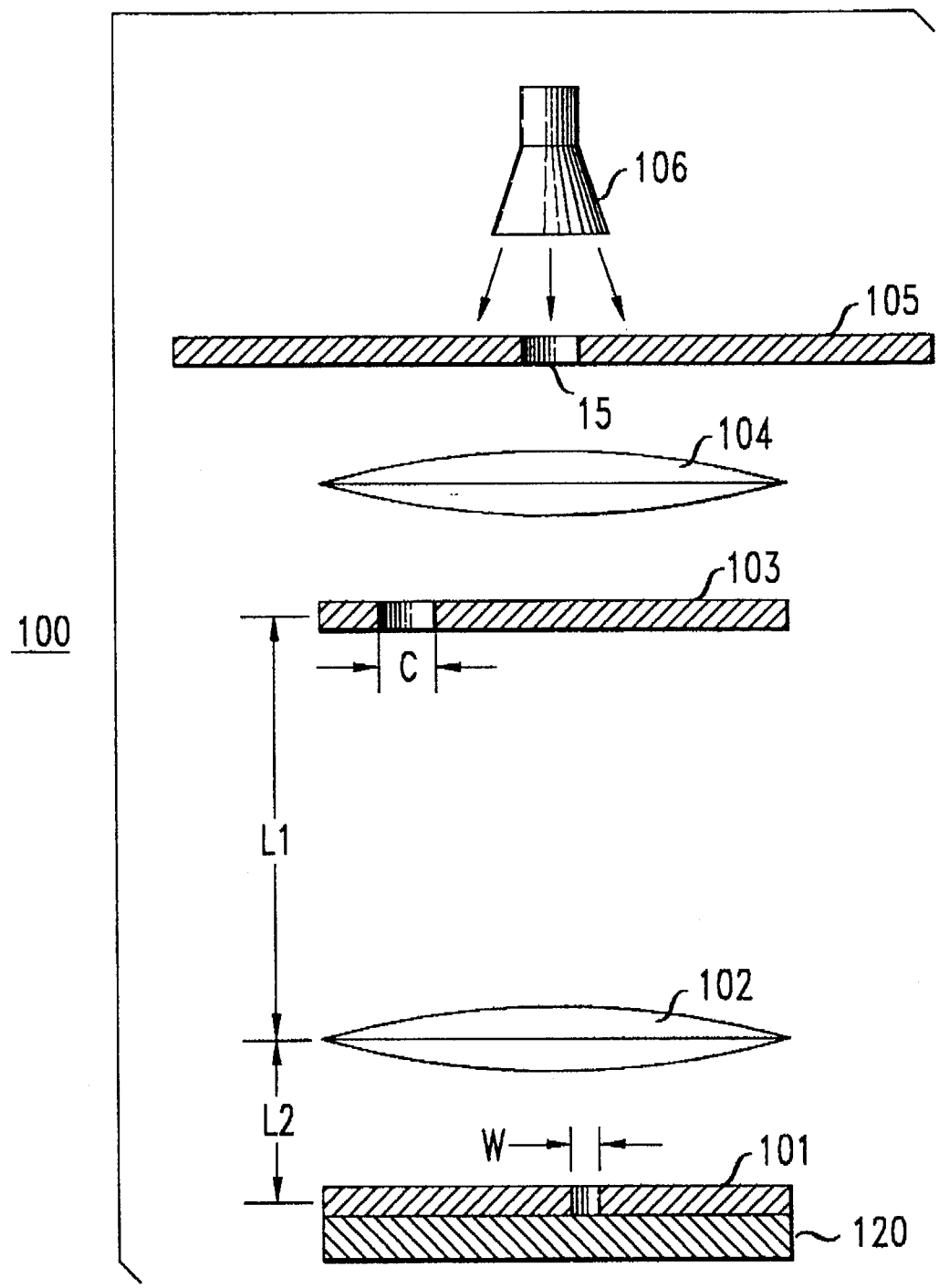
FIGS. 1 and 2 depict optical lithographic systems useful in the practice of this invention.
Figure 2:
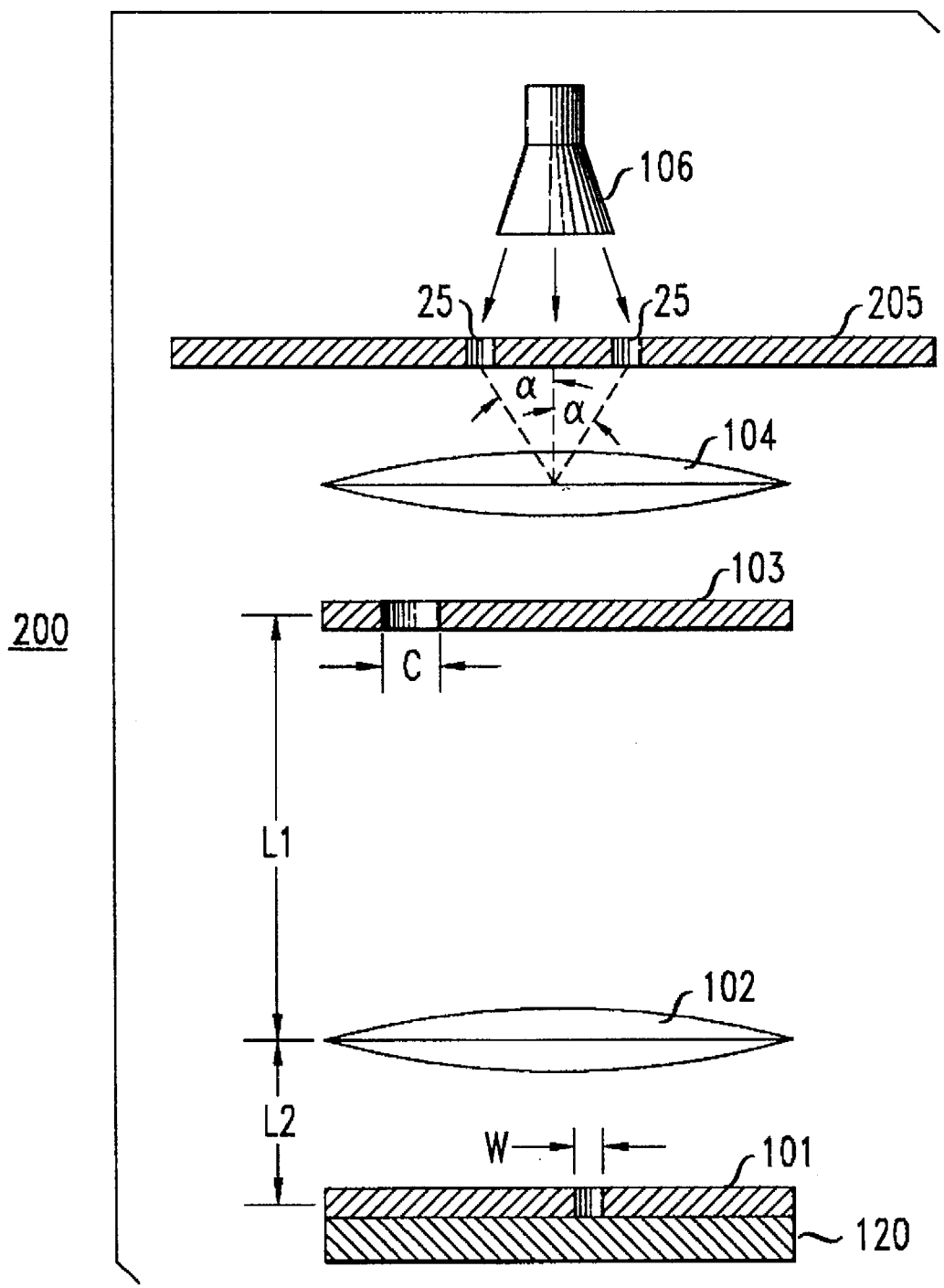

In the following Examples, various specific embodiments of the mask according to the invention will be described. It should be understood that each of these masks is to be used in an optical lithographic system such as the previously described system 100 (FIG. 1) or the previously described system 200 (FIG. 2).

EXAMPLE 1

Figure 3:
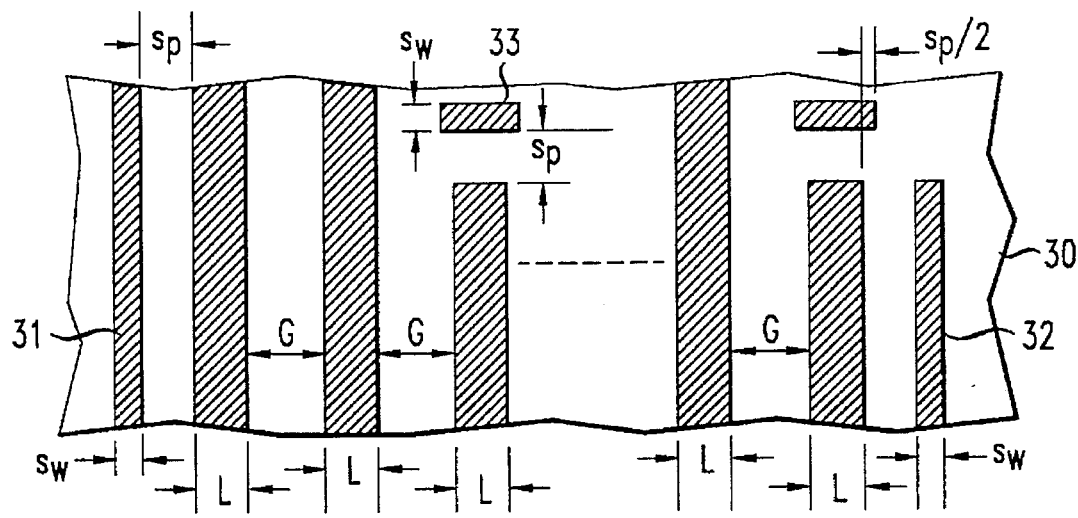
FIGS. 3 through 6 are top-view diagrams of portions of an optical mask, according to various embodiments of the invention.

A patterned optical lithographic mask has a portion 30 indicated in FIG. 3. This portion 30 comprises a group of parallel line segments, each representing a portion of a main feature (hereinafter, "main line segment") having a width L. Between adjacent line segments there exist mutually equal gap distances G, such that $1.0 \leq G/L \leq 1.5$ and $L \leq (0.5)(NA)/\lambda$. As used hereinafter in all Examples, the term "line segment" refers to the situation in which the length of the segment is equal to at least three times as much as the width L. Advantageously, these line segments have a common optical intensity transmission coefficient T that lies in the approximate range of 0.05 to 0.15, typically T=0.10, approximately; alternatively, they are all opaque (i.e., T=0.00, approximately). Hereinafter the term "attenuation" will be used to describe situations in which T falls in the approximate range of 0.05 to 0.15 rather than T being equal to approximately 0.00 ("opaque"). The gaps between the line segments are all substantially transparent (T=1.0).

A pair of assist features 31 and 32 are located at the outside edges of the extreme left-hand and right-hand line segments (FIG. 3). Each of these assist features 31 and 32 has approximately the same transmission coefficient T as that of the line segments ("main features") themselves. Each of these assist features has a width $s_w$ equal to approximately $(0.25)\lambda/(NA)$ and is spaced apart from the nearest line segment by a distance $s_p$ that is equal to approximately $(0.5)\lambda/(NA)$. It should be recognized that this Example 1 is a case of "bright field" main features—i.e., dark main features that are situated on the mask in an environment of bright surroundings.

Besides the above-described assist features 31 and 32, advantageously assist features 33 are also added at the ends (if any) of each main line segment. Each such assist feature 33 is centrally located with respect to the end (hereinafter, "termination") of the main line segment and has a width that extends a distance equal to $s_p/2$ to the left-hand and to the right-hand directions and that extends a distance equal to approximately $s_w$ in the direction parallel to the main line feature, where $s_p$ and $s_w$ are as defined before. In addition, each such assist feature 33 is spaced from the termination of the main line feature by a distance equal to approximately $s_p$, where $s_p$ is as defined above.

EXAMPLE 2

In this Example 2, the regions in FIG. 3 for which T is attenuated—i.e., falls in the approximate range of 0.05 to 0.15, typically approximately 0.10 (or alternatively the regions in FIG.3 for which T=0.00)—are replaced with substantially transparent regions of the same geometry as those of the original regions for which T=0.10 (or alternatively for which T=0.00), and the regions that were substantially transparent are replaced with regions for which T=0.10 (or alternatively for which T=0.00). It should be easily recognized that this Example 2 is a case of "dark field" main features—i.e., bright main features situated in an environment of dark surroundings.

EXAMPLE 3

In this Example 3 the situation with respect to the main object features—i.e., the line segments (but not the assist features)—is the same as that described above in conjunction with FIG. 3 (and hence is the same as Example 1 or 2) except that in this Example 3 the ratio G/L satisfies: $1.5 \leq G/L \leq 3.0$.

In this Example 3, moreover, an assist feature of the same kind as that described under the above Example 1 or 2—i.e., that for which $s_w=(0.25)\lambda/(NA)$, approximately—depending upon whether the situation is bright field or dark field, respectively, is inserted midway between every adjacent main line segment. Such an assist feature is also advantageously inserted at a distance $s_p=0.5\lambda/(NA)$, approximately, from the outside edges of the extreme left-hand and right-hand main line segments.

EXAMPLE 4

In this Example 4 the situation is the same as those describe under Example 3 except that G/L satisfies: $3<G/L$. In this case, each of the main line segments has an assist feature both on its own left-hand edge and on its own right-hand edge again for which $s_p=(0.5)\lambda/(NA)$, approximately, and for which $s_w=(0.25)\lambda/(NA)$, approximately.

EXAMPLE 5

Figure 4:
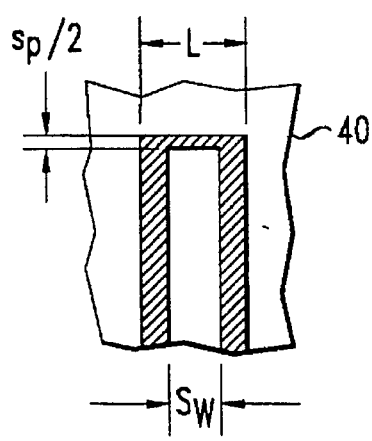

In this Example 5, the situation is the same as that described under Example 1 or 2 except that in this Example 5, L is approximately equal to $\lambda/(NA)$. In this Example 5, as indicated in FIG. 4, an assist feature 46 is inserted centrally inside each main line segment, rather than on the outside as in the above Examples 1, 2, 3, and 4. In FIG. 4, the quantities $s_p$ and $s_w$ are defined in terms of L, NA, and $\lambda$ in the same way as in Example 1. No assist feature is to be inserted outside the main line segment.

EXAMPLE 6

In this Example 6 the situation is the same as that described in Examples 1 or 2 except that in the situation of this Example 6, $L \geq (1.5)\lambda/(NA)$, and here no assist feature is required.

EXAMPLE 7

Figure 5:
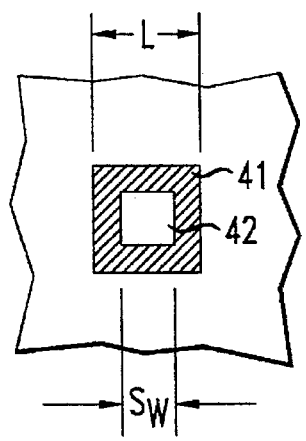

In this Example 7, a patterned optical lithographic mask (FIG. 5) has a portion 45. This portion 45 comprises a main square object feature 41, whose sides have lengths equal to $L=\lambda/(NA)$ to within approximately 20 percent, and for which the optical transmission coefficient (hereinafter, "tone") T lies in the approximate range of 0.5 to 0.15 (typically approximately 0.10) or for which T=1.0 (substantially transparent), the main square feature 41 being located either in a bright field (FIG. 5) or in a dark field (not shown), respectively. In either case, a square-shaped assist feature 42, centrally located within the main feature 41, is added. This square-shaped assist feature 42 has the form of a square, and it has an opposite transmission tone from that of the main square feature 41. The length of each side of the square-shaped assist feature 42 is equal to $s_w=(0.25)\lambda/NA$), approximately. In this case, advantageously ON-axis illumination is used. In addition, the main feature 41 advantageously is designed such that it imparts a phase shift, to the radiation of wavelength $\lambda$ propagating through the system 100 (FIG. 1) or 200 (FIG. 2), that is approximately equal to $\pi(=180°)$ relative to the common phase shift imparted by the assist feature 42 and the surroundings (field). In this way the optical intensity of unwanted side lobes is reduced.

Instead of a main feature 41 that is square-shaped, a circular-shaped main feature having a diameter equal to 2L can be assisted by an assist feature whose diameter is approximately equal to $s_w$, where L and $s_w$ are the same as defined above for the square-shaped main feature 41.

EXAMPLE 8

Figure 6:
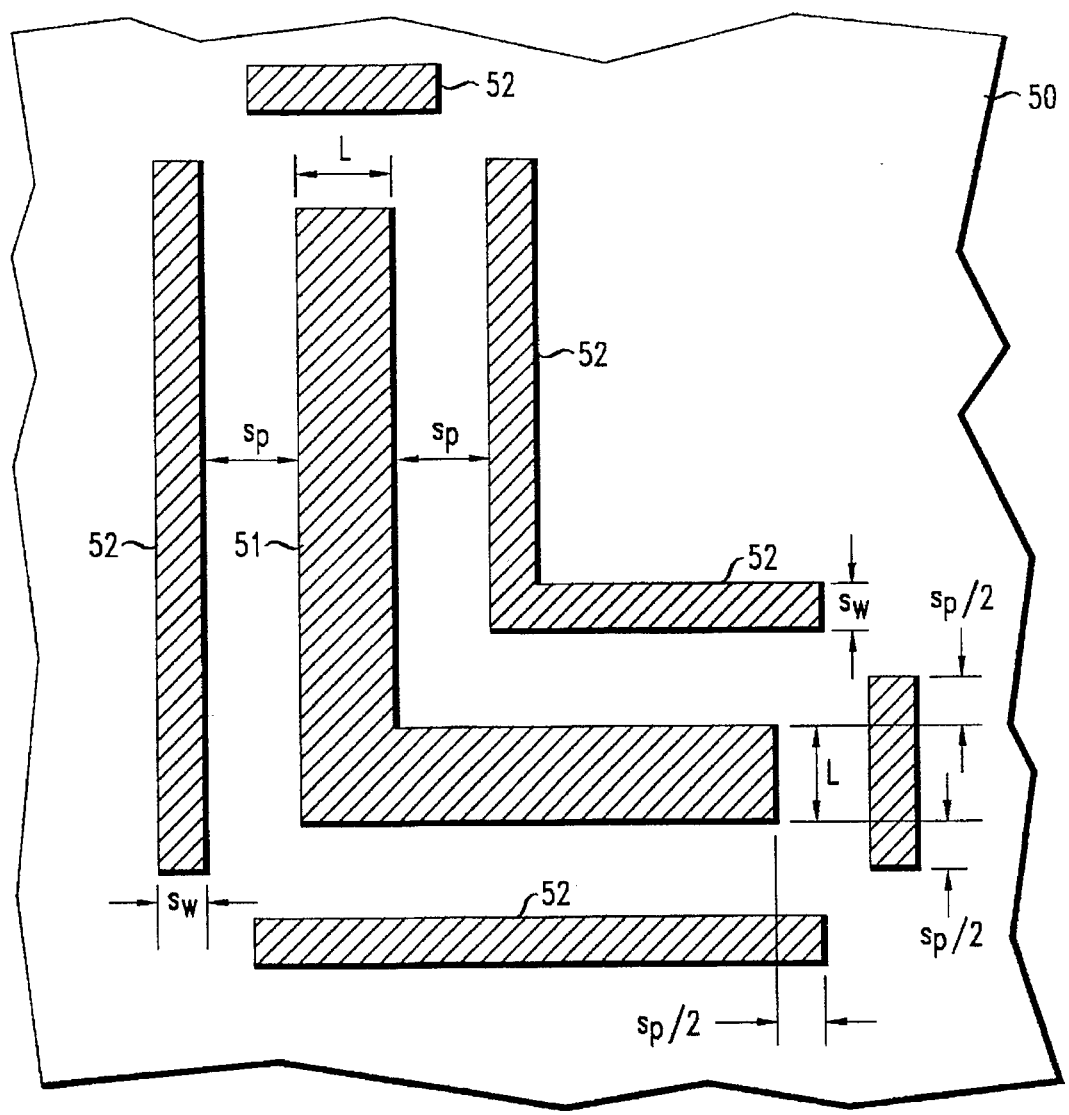

In this Example 8, a patterned optical lithographic mask has a portion 50 indicated in FIG. 6. This portion 50 comprises a main L-shaped feature 5 1, whose width $L=(0.5)\lambda/NA$ to within approximately 20 percent, and for which the optical transmission coefficient (hereinafter, "tone") T lies in the approximate range of 0.5 to 0.15 (typically, approximately 0.10) or for which T=1.0 (substantially transparent), the main L-shaped feature 51 being located either in a bright field or in a dark field, respectively. In either case, as indicated in FIG. 6, assist features 52 are added each having a transmission tone that is the same as that of the main feature 51. The width $s_w$ of each of the assist features 52 is everywhere approximately equal to $s_p/2$, where $s_p=(0.5)\lambda/(NA)$, approximately. Also, each of the assist features 52 is spaced apart from the main feature 51 by a distance that is approximately equal to $s_p$.

In this Example 8, either ON- or OFF-axis illumination can be used. On the other hand, in this Example 8, the material of the mask is advantageously designed such that the surrounding field as well as the space between the main feature 51 and the assist features 52 impart a phase shift of approximately $\pi(=180°)$, to the radiation of wavelength $\lambda$ propagating through the system 100 (FIG. 1) or 200 (FIG. 2), relative to the common phase shift imparted by the main feature 51 and the assist features 52.

In the situations described above in conjunction with Examples 1–6, preferably OFF-axis illumination is used in conjunction with a transmission coefficient T that falls in the approximate range between 0.05 and 0.15. However, in cases where all main features of the mask are isolated (i.e., are spaced apart by more than $(1.5)\lambda/(NA)$) and are clear features (dark field) whose widths are less than approximately $(0.75)\lambda/(NA)$, the added advantage of OFF-axis illumination is not significant. Finally, OFF-axis illumination without attenuation but with assist features results in a significant improvement in the imaging process as opposed to omission of the assist features, but such an arrangement is not as good for imaging purposes as is OFF-axis illumination with attenuation except in the case described in the immediately preceding sentence.

Although the invention has been described in detail in terms of specific embodiments, various modifications can be made without departing from the scope of the invention.

I claim:

1. An optical system for producing an image feature on an image surface by means of directing optical radiation onto a patterned mask, the radiation containing a wavelength $\lambda$, the patterned mask having a main object feature in the form of the image feature, the main object feature having a portion whose width is everywhere less than $(1.5)\lambda/NA$, where NA is the numerical aperture of the image side of the system, an assist feature whose width is everywhere less than $(0.5)\lambda/NA$, the assist feature being located on the mask in a neighborhood of said portion of the main object feature, and the assist feature either (1) being located outside the periphery of said portion of the object feature and having a distance of closest approach to the said portion of the main object feature that is everywhere equal to less than $\lambda/NA$ or (2) being located inside the periphery of the said portion of the object feature.

2. The system of claim 1 in which the optical radiation is OFF-axis illumination.

3. The system of claim 1 in which the assist feature is located outside the object feature and in which both the assist feature and the object feature have optical intensity transmission coefficients in the range of about 0.05 to 0.15.

4. The system of claim 3 in which the optical radiation is OFF-axis illumination.

5. The system of claim 1 in which the assist feature is located outside the object feature and in which regions of the mask located in areas between the assist feature and the object feature have optical intensity transmission coefficients in the range of about 0.05 to 0.15.

6. The system of claim 5 in which the optical radiation is OFF-axis illumination.

7. The system of claim 1 in which the assist feature is located inside the object feature and has an optical transmission coefficient in the range of about 0.05 to 0.

8. The system of claim 7 in which the optical radiation is OFF-axis illumination.

9. The system of claim 1 in which the assist feature is located inside the object feature and in which the object feature has an optical intensity transmission coefficient in the range of about 0.05 to 0.15.

10. The system of claim 9 in which the optical radiation is OFF-axis illumination.

11. The system of claim 1 further comprising a photoresist layer located on the image surface and a source of the optical radiation.

12. The system of claim 2 further comprising a photoresist layer located on the image surface and a source of the optical radiation.

13. The system of claim 3 further comprising a photoresist layer located on the image surface and a source of the optical radiation.

14. The system of claim 4 further comprising a photoresist layer located on the image surface and a source of the optical radiation.

15. The system of claim 5 further comprising a photoresist layer located on the image surface and a source of the optical radiation.

16. The system of claim 6 further comprising a photoresist layer located on the image surface and a source of the optical radiation.

17. The system of claim 7 further comprising a photoresist layer located on the image surface and a source of the optical radiation.

18. The system of claim 8 further comprising a photoresist layer located on the image surface and a source of the optical radiation.

19. The system of claim 9 further comprising a photoresist layer located on the image surface and a source of the optical radiation.

20. The system of claim 10 further comprising a photoresist layer located on the image surface and a source of the optical radiation.

* * * * *

UNITED STATES PATENT AND TRADEMARK OFFICE
CERTIFICATE OF CORRECTION

PATENT NO. : 5,636,002
DATED : June 3, 1997
INVENTOR(S) : Joseph G. Garofalo

It is certified that error appears in the above-identified patent and that said Letters Patent is hereby corrected as shown below:

Column 7,
Line 23, replace claim 1 with the following:
-- 1. An optical system for producing an image feature on an image surface by means of directing optical radiation onto a patterned mask, the radiation containing a wavelength $\lambda$,
  the patterned mask having an object feature in the form of said image feature, said object feature having a width less than $(1.5)\lambda/NA$, where NA is the numerical aperture of the image side of the system, and said mask further having associated with said object feature an assist feature whose width is everywhere less than $(0.5)\lambda/NA$, said assist feature being located on said mask in the neighborhood of said object feature,
  said assist feature either (1) being located outside the periphery of said object feature and having a distance of closest approach to said object featrue that is equal to or less than $\lambda/NA$ or (2) being located inside the periphery of said object feature; and said assist feature and said object feature project onto said image surface as said image feature with enhanced resolution as compared with the projected image of said object feature alone. --.

Signed and Sealed this

Sixteenth Day of May, 2006

JON W. DUDAS
*Director of the United States Patent and Trademark Office*